(12) United States Patent
Akutsu et al.

(10) Patent No.: US 9,128,166 B2
(45) Date of Patent: Sep. 8, 2015

(54) SECONDARY BATTERY TESTER, SECONDARY BATTERY TESTING METHOD, AND MANUFACTURING METHOD OF SECONDARY BATTERY

(75) Inventors: Tomomi Akutsu, Tokyo (JP); Daisuke Yamazaki, Tokyo (JP); Nobuhiro Tomosada, Tokyo (JP); Atsufumi Kimura, Tokyo (JP); Makoto Kawano, Tokyo (JP); Souichirou Torai, Tokyo (JP); Tetsuo Yano, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 589 days.

(21) Appl. No.: 13/277,591

(22) Filed: Oct. 20, 2011

(65) Prior Publication Data

US 2012/0182020 A1 Jul. 19, 2012

(30) Foreign Application Priority Data

Jan. 13, 2011 (JP) ................................. 2011-004989
Sep. 9, 2011 (JP) ................................. 2011-197065

(51) Int. Cl.
| | | |
|---|---|---|
| *G01N 27/416* | (2006.01) | |
| *G01R 31/36* | (2006.01) | |
| *H01M 10/42* | (2006.01) | |
| *H01M 10/48* | (2006.01) | |

(52) U.S. Cl.
CPC ....... *G01R 31/3662* (2013.01); *H01M 10/4285* (2013.01); *H01M 10/48* (2013.01); *G01R 31/3648* (2013.01); *Y02E 60/12* (2013.01)

(58) Field of Classification Search
CPC .......... G01R 31/3662; G01R 31/3658; G01R 31/3679; H01M 10/48; H01M 10/052; H01M 10/4285; Y02E 60/12; Y02E 60/122; Y02T 10/7011
USPC ................. 324/425, 426, 430, 432, 434, 150; 320/158, 132; 702/63
See application file for complete search history.

(56) References Cited

U.S. PATENT DOCUMENTS

| | | | |
|---|---|---|---|
| 4,687,996 A | | 8/1987 | Okazaki et al. |
| 5,525,890 A | * | 6/1996 | Iwatsu et al. .................. 320/106 |
| 5,773,978 A | | 6/1998 | Becker et al. |

(Continued)

FOREIGN PATENT DOCUMENTS

| | | |
|---|---|---|
| CN | 1241304 A | 1/2000 |
| CN | 1314012 A | 9/2001 |

(Continued)

OTHER PUBLICATIONS

Balbuena, P.B., Wang, Y.X., Lithium Ion Batteries: Solid Electrolyte Interphase, Imperial College Press, London. 2004.*

(Continued)

*Primary Examiner* — Patrick Assouad
*Assistant Examiner* — Sean Curtis
(74) *Attorney, Agent, or Firm* — Sughrue Mion, PLLC

(57) ABSTRACT

There is provided a secondary battery tester for testing a state of a secondary battery based on an impedance characteristic of the secondary battery. The tester includes: an impedance acquiring section configured to acquire an impedance value of the secondary battery; and a determining section configured to determine a state of a solid electrolyte interface (SEI) layer of the secondary battery based on the impedance value acquired by the impedance acquiring section.

15 Claims, 3 Drawing Sheets

(56) References Cited

U.S. PATENT DOCUMENTS

| | | | |
|---|---|---|---|
| 6,037,777 A | 3/2000 | Champlin | |
| 6,265,877 B1 | 7/2001 | Kimura et al. | |
| 6,307,378 B1 * | 10/2001 | Kozlowski | 324/430 |
| 6,480,003 B1 | 11/2002 | Ugaji et al. | |
| 6,492,064 B1 * | 12/2002 | Smart et al. | 429/330 |
| 8,346,495 B2 * | 1/2013 | Gering | 702/63 |
| 8,521,497 B2 * | 8/2013 | Gering | 703/13 |
| 8,570,046 B2 * | 10/2013 | Hart et al. | 324/430 |
| 8,754,611 B2 * | 6/2014 | Greening et al. | 320/112 |
| 2009/0259420 A1 * | 10/2009 | Greening et al. | 702/63 |
| 2010/0124701 A1 * | 5/2010 | Naoi et al. | 429/144 |
| 2010/0156351 A1 | 6/2010 | Ugaji et al. | |
| 2010/0264881 A1 | 10/2010 | Yin et al. | |
| 2011/0027646 A1 * | 2/2011 | Lee et al. | 429/188 |
| 2011/0171514 A1 * | 7/2011 | Nishikawa et al. | 429/144 |
| 2011/0245074 A1 * | 10/2011 | Smith et al. | 502/309 |
| 2011/0301931 A1 * | 12/2011 | Gering | 703/13 |
| 2012/0021264 A1 * | 1/2012 | Morishima | 429/94 |
| 2014/0008976 A1 * | 1/2014 | Yebka et al. | 307/23 |

FOREIGN PATENT DOCUMENTS

| | | | |
|---|---|---|---|
| CN | 1225649 C | | 11/2005 |
| CN | 101527448 A | | 9/2009 |
| CN | 101542821 A | | 9/2009 |
| JP | 60-166875 A | | 8/1985 |
| JP | 4-43975 A | | 2/1992 |
| JP | 11-32442 A | | 2/1999 |
| JP | 2000-299137 A | | 10/2000 |
| JP | 2003-100351 A | | 4/2003 |
| JP | 2003-317810 A | | 11/2003 |
| JP | 2008-130544 A | | 6/2008 |
| JP | 2009-145137 A | | 7/2009 |
| JP | 2011086451 A | * | 4/2011 |
| JP | 2011222358 A | * | 11/2011 |
| JP | 2011252930 A | * | 12/2011 |
| JP | 5445014 B2 | * | 3/2014 |
| KR | 2002-0053839 A | | 7/2002 |
| WO | 01/33657 A1 | | 5/2001 |

OTHER PUBLICATIONS

Garthwaite, Josie. Why Lithium-ion Batteries Die So Young, Gigaom, Inc., 2014.*

Pinson et al., Theory of SEI Formation in Rechargeable Batteries, Oct. 2012, version 3.*

Love et al., State-of-health monitoring of 18650 4S packs with a single-point impedance diagnostic, Elsevier B.V, Mar. 2014.*

Howey et al., Impedance measurement for advanced battery management systems, Dept of Engineering Sciences, University of Oxford, Nov. 2013.*

Office Action dated Jan. 6, 2014 issued by the State Intellectual Property Office of P.R. China in corresponding Chinese Application No. 201110360633.X.

Jiangfeng, et al., "Progress in Solid Electrolyte Interface in Lithium Ion Batteries", Progress in Chemistry, vol. 16, No. 2, May 2004, pp. 335-342.

* cited by examiner

SECONDARY BATTERY TESTER, SECONDARY BATTERY TESTING METHOD, AND MANUFACTURING METHOD OF SECONDARY BATTERY

This application claims priority from Japanese Patent Applications No. 2011-004989, filed on Jan. 13, 2011, and No. 2011-197065, filed on Sep. 9, 2011, the entire contents of which are herein incorporated by reference.

BACKGROUND

1. Technical Field

The present disclosure relates to, for example, a secondary battery tester for testing the state of a secondary battery on the basis of its impedance characteristic.

2. Related Art

To determine whether or not a secondary battery has been manufactured normally, a self-discharge test (shelf test) is performed immediately after the manufacture. In this test, a test subject battery is charged to a prescribed voltage V1 and a voltage V2 is measured after it has been left as it is for a prescribed time $\Delta t$. Furthermore, a good/bad determination is performed by estimating a self-discharge amount on the basis of a thus-obtained voltage fall ratio $(V1-V2)/\Delta t$. Whereas in many cases a full-charging voltage is employed as the voltage V1, a voltage that is lower than the full-charging voltage may be used as the voltage V1 depending on the characteristics of a battery.

However, at room temperature, self-discharge proceeds very slowly and hence the voltage variation rate is very low, as a result of which about two weeks are necessary for detection of a clear voltage reduction. Thus, the self-discharge test is a bottle neck of a test process. A self-discharge test is sometimes conducted in a shorter time in such a manner that a battery is left as it is in a very low voltage range approximately corresponding to an SOC 0% where a relatively fast voltage variation occurs and its temperature is kept high to accelerate the self-discharge. However, leaving a battery as it is in a very low voltage range may cause an overdischarge state, and a discharge at a high temperature may accelerate deterioration of the battery (an originally non-defective battery may be damaged). In there circumstances, development of an improved self-discharge test method, in particular, a method capable of determining, simply in a short time, whether or not a battery is defective in self-discharge performance, is desired.

On the other hand, methods for detecting a defect in a secondary battery are disclosed in Japanese Patent Documents JP-A-2003-100351, JP-A-2009-145137, JP-A-2003-317810 and JP-A-2000-299137, for example. JP-A-2003-100351 discloses a technique of detecting deposition of metal ions on the basis of a voltage variation in charging that is done at the initial stage of manufacture. JP-A-2009-145137 discloses a technique of detecting a difference in voltage variation from a standard battery. JP-A-2003-317810 discloses a technique of making a determination "abnormal" if reaction resistance is small. JP-A-2000-299137 discloses a technique of determining an initial activity characteristic on the basis of impedance of a nickel-hydrogen battery. However, none of these conventional techniques can properly evaluate the state of an SEI (solid electrolyte interface) layer that is formed on the negative electrode surface of a lithium ion secondary battery. In lithium ion secondary batteries, such abnormalities as a self-discharge defect occur depending on the state of an SEI layer. Therefore, none of the conventional techniques can properly determine whether a lithium ion secondary battery is good or bad. Lithium ion secondary batteries have a characteristic that the impedance varies to a large extent with the charging factor. Although there should exist a proper charging factor for recognition of the state of an SEI layer, the conventional techniques do not refer to this point.

Impedance values of secondary batteries measured in a self-discharge test process have a large variation and this measurement is low in reproducibility.

Also, in a self-discharge test process, the voltage of a secondary battery should be kept close to, for example, a voltage corresponding to full charging because a secondary battery is damaged if it is discharged excessively.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages.

It is an illustrative aspect of the present invention to provide a secondary battery tester which can detect the state of an SEI layer of a secondary battery, in particular, a lithium ion secondary battery. Also, it is another illustrative aspect of the present invention to provide a secondary battery tester and a secondary battery testing method which can determine, in a short time, whether a secondary battery is good or bad. Furthermore, it is another illustrative object of the present invention to provide a secondary battery tester and a secondary battery testing method which can determine a cause of occurrence of a defective secondary battery.

According to one or more illustrative aspects of the present invention, there is provided a secondary battery tester for testing a state of a secondary battery based on an impedance characteristic of the secondary battery. The tester includes: an impedance acquiring section configured to acquire an impedance value of the secondary battery; and a determining section configured to determine a state of a solid electrolyte interface (SEI) layer of the secondary battery based on the impedance value acquired by the impedance acquiring section.

According to one or more illustrative aspects of the present invention, the determining section is configured to determine the state of the SEI layer based on a shape of an arc of a Nyquist plot of the impedance value.

According to one or more illustrative aspects of the present invention, the secondary battery is a lithium ion secondary battery; and the impedance acquiring section is configured to acquire the impedance value of the secondary battery when a voltage of the secondary battery is close to a lower limit of a use voltage range of the secondary battery.

According to one or more illustrative aspects of the present invention, the determining section is configured to detect that the SEI layer is abnormal due to hydrofluoric acid, based on the impedance value.

According to one or more illustrative aspects of the present invention, the determining section is configured to detect that the SEI layer is abnormal due to micro-short-circuiting, based on the impedance value.

According to one or more illustrative aspects of the present invention, the impedance acquiring section is configured to acquire an impedance value of the secondary battery for each of a plurality of frequencies.

According to one or more illustrative aspects of the present invention, there is provided a method of testing a state of a secondary battery based on an impedance characteristic of the secondary battery. The tester includes: (a) acquiring an impedance value of the secondary battery; and (b) determining a state of a solid electrolyte interface (SEI) layer of the secondary battery based on the impedance value.

According to one or more illustrative aspects of the present invention, there is a secondary battery tester for testing a state of a secondary battery based on an impedance characteristic of the secondary battery. The tester includes: a voltage setting section configured to set a voltage of the secondary battery to a voltage that is close to a lower limit of a use voltage range of the secondary battery; an impedance acquiring section configured to acquire an impedance value of the secondary battery; and a determining section configured to determine a state of the secondary battery based on the impedance value acquired by the impedance acquiring section.

According to one or more illustrative aspects of the present invention, the determining section is configured to determine whether self-discharge of the secondary battery is defective or not, based on impedance value.

According to one or more illustrative aspects of the present invention, there is provided a method of manufacturing a secondary battery. The method includes: testing a state of the secondary battery based on an impedance characteristic of the secondary battery. The testing step includes: (a) setting a voltage of the secondary battery to a voltage that is close to a lower limit of a use voltage range of the secondary battery; (b) acquiring an impedance value of the secondary battery; and (c) determining a state of the secondary battery based on the impedance value.

According to the secondary battery tester and the secondary battery testing method, it is possible to produce test results that are small in variation and high in reproducibility.

Other aspects and advantages of the present invention will be apparent from the following description, the drawings and the claims.

DETAILED DESCRIPTION

A secondary battery tester according to an embodiment of the present invention will be now described with reference to the accompany drawings.

Figure 1:
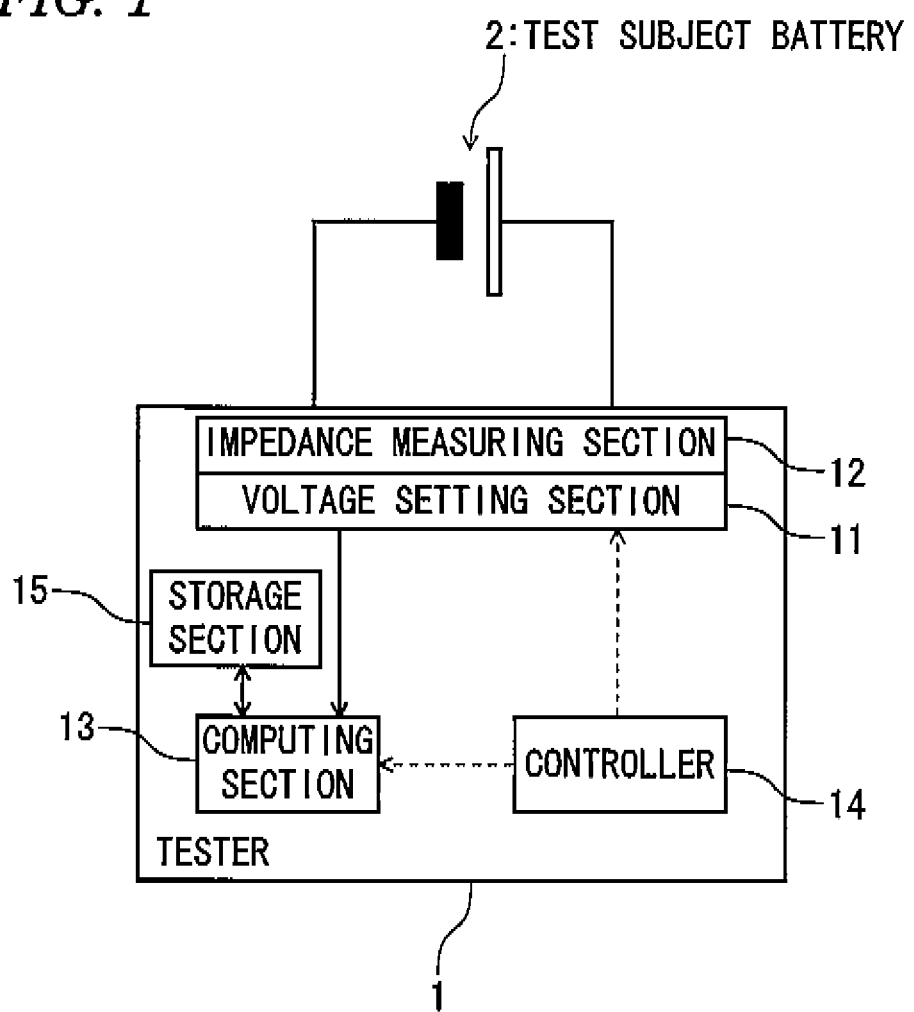
FIG. 1 is a block diagram showing the configuration of a tester according to an embodiment.

FIG. 1 is a block diagram showing the configuration of a tester according to the embodiment.

As shown in FIG. 1, the tester 1 according to the embodiment is equipped with a voltage setting section 11 for setting a voltage of a test subject battery 2 which is a lithium ion secondary battery by charging or discharging it, an impedance measuring section 12 for measuring impedance values of the test subject battery 2, a computing section 13 for performing a calculation for evaluating the test subject battery 2 on the basis of measurement results of the impedance measuring section 12, and a controller 14 for controlling the voltage setting section 11 and the impedance measuring section 12.

The tester 1 is connected between the positive electrode and the negative electrode of the test subject battery 2. More specifically, each of the voltage setting section 11 and the impedance measuring section 12 is connected between the positive electrode and the negative electrode of the test subject battery 2.

Measurement values of the impedance measuring section 12 are input to the computing section 13. Outputs of the controller are input to the voltage setting section 11 and the impedance measuring section 12.

The tester 1 is also equipped with a storage section 15 for storing impedance measurement values. The storage section 15 is connected to the computing section 13. The storage section 15 is stored with prescribed impedance values that should be obtained if a manufactured lithium ion secondary battery is a good one. A peak position of an arc in an impedance Nyquist plot is stored in the storage section 15. This arc is caused by chemical reaction.

Furthermore, the storage section 15 is stored with a pass/rejection threshold value as well as an arc peak deviation presence/absence threshold value.

Figure 2:
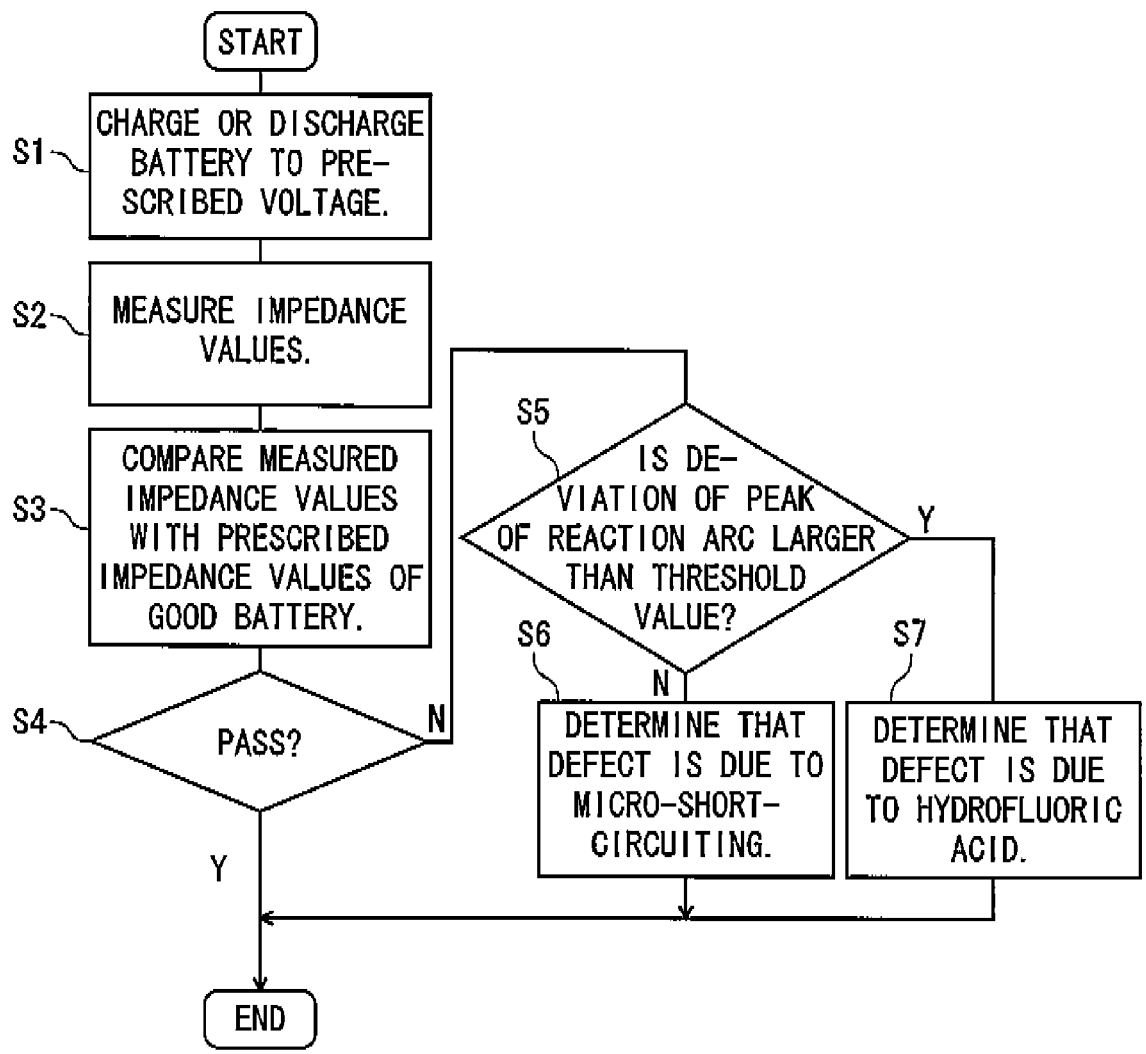
FIG. 2 is a flowchart of a process which is executed by the tester of FIG. 1.

FIG. 2 is a flowchart of a process which is executed by the tester 1 according to the embodiment shown in FIG. 1.

At step S1 shown in FIG. 2, the voltage setting section 11 charges or discharges a manufactured test subject battery 2 to a prescribed voltage.

It is preferable that the battery voltage employed be close to the lower limit of a use voltage range and correspond to a such charged state that an overdischarge does not occur during a test. In such a charged state, the state of the negative electrode surface strongly governs the impedance of the entire battery and hence the state of an SEI layer can be recognized correctly.

Setting the voltage of a test subject battery 2 to a voltage that is close to the lower limit of a use voltage range by using the voltage setting section 11 was discovered first by the present inventors.

At step S1, the voltage setting section 11 charges or discharges a manufactured test subject battery 2 until the voltage of the test subject battery 2 reaches the lower limit of the use voltage range. The process moves to step S2 as soon as the voltage of the test subject battery 2 reaches the lower limit of the use voltage range.

At step S2, the impedance measuring section 12 measures impedance values of the test subject battery 2 which has been charged or discharged to the prescribed voltage.

At step S2, impedance measurement values are made stable and high reproducibility is attained if the tester 1 and the test subject battery 2 satisfy prescribed environmental conditions. Impedance values of the test subject battery 2 are measured at plural frequencies (low frequencies to high frequencies) by AC measurement.

At step S2, the computing section 13 calculates a peak position of an arc in an impedance Nyquist plot of the test subject battery 2.

The process moves to step S3 upon completion of the measurement by the impedance measuring section 12.

At step S3, the computing section 13 compares the impedance measurement values of the impedance measuring section 12 with the respective prescribed impedance values which should be obtained if a manufactured lithium ion secondary battery is a good one and which are stored in the storage section 15.

The process moves to step S4 upon completion of the comparison by the computing section 13.

At step S4, the computing section 13 determines whether or not the test subject battery 2 should pass the test on the basis of comparison results of step S3. The process is finished if the determination result is affirmative. In this case, since the test subject battery 2 is a good one, a transition is made to a shipment process. On the other hand, if the determination result is negative, the process moves to step S5.

For example, at step S4, the computing section 13 determines that the test subject battery 2 should pass the test if differences between the measurement values of the impedance measuring section 12 and the respective impedance values stored in the storage section 15 are smaller than the prescribed value (the pass/rejection threshold value stored in the storage section 15). And the computing section 13 determines that the test subject battery 2 should be rejected if differences between the measurement values of the impedance measuring section 12 and the respective impedance values stored in the storage section 15 are larger than the prescribed value.

Alternatively, at step S4, the computing section 13 determines that the test subject battery 2 should pass the test if ratios of the measurement values of the impedance measuring section 12 to the respective impedance values stored in the storage section 15 are smaller than the prescribed value (the pass/rejection threshold value stored in the storage section 15). And the computing section 13 determines that the test subject battery 2 should be rejected (S4: no) if ratios of the measurement values of the impedance measuring section 12 to the respective impedance values stored in the storage section 15 are larger than the prescribed value.

If the computing section 13 determines that the test subject battery 2 should pass the test, the process is finished. On the other hand, if the computing section 13 determines that the test subject battery 2 should be rejected (S4: no), the process moves to step S5.

At step S5, the computing section 13 compares a peak position (real part) of an impedance characteristic of the test subject battery 2 obtained by the impedance measurement of the impedance measuring section 12 with the peak position (real part) of the prescribed impedance characteristic (representative characteristic) stored in the storage section 15, and determines whether or not the positions of the peaks of the two arcs are deviated from each other. The details of the manner of determination performed at step S5 will be described later.

If a difference (or ratio) between the real part of the peak value of the arc of the impedance characteristic of the test subject battery 2 and the real part of the peak value of the impedance characteristic stored in the storage section 15 is smaller than the prescribed value (arc peak deviation presence/absence threshold value), the process moves to step S6.

If the difference (or ratio) between the real part of the peak value of the arc of the impedance characteristic of the test subject battery 2 and the real part of the peak value of the impedance characteristic stored in the storage section 15 is larger than the prescribed value (arc peak deviation presence/absence threshold value), the process moves to step S7.

At step S6, the computing section 13 determines that the SE layer of the test subject battery 2 has an abnormality caused by micro-short-circuiting. Then, the process is finished. On the other hand, at step S7, the computing section 13 determines that the SEI layer of the test subject battery 2 has an abnormality caused by hydrofluoric acid. Then, the process is finished.

In general, the self-discharge of a lithium ion secondary battery is a phenomenon that lithium ions inserted in the negative electrode are desorbed unintentionally, and it appears to be a fall of the battery voltage when observed from the outside. A layer called an SEI (solid electrolyte interface) layer through which lithium ions permeate but electrons do not exists on the negative electrode surface of a lithium ion secondary battery. It is considered that the characteristics of the SEI layer have a great influence on the self-discharge. If insulation against electrons of the SEI layer is lowered at some portions due to a certain defect-causing factor, electrons are desorbed from the negative electrode through those defective portions and lithium ions are also desorbed in the same number to cause a self-discharge.

A first factor in causing a self-discharge failure is a phenomenon that water that was mixed as an impurity during manufacture reacts with lithium salts to cause hydrofluoric acid, which destroys organic components of the SEI layer to cause defective portions where insulation against electrons is lowered. In this case, electrons and lithium ions desorbed through the defective portions react with a solvent or organic components of the SEI layer (side reaction) as an attempt to restore insulation of the SEI layer.

A second factor in causing a self-discharge failure is micro-short-circuiting. In general, micro-short-circuiting due to foreign metal substances is in many cases considered a cause of a self-discharge. However, in the case of micro-short-circuiting due to substances that are high in electron conductivity, lithium ions are desorbed immediately after insertion into the electrode and hence the capacity is also appears to be lowered. In manufacturing/test processes of many battery factories, a self-discharge test is conducted last and a capacity test is performed before it. Therefore, a battery in which micro-short-circuiting due to foreign metal substances has occurred is determined defective at the capacity test stage and is not subjected to a self-discharge test. That is, in the embodiment, a battery that is determined defective in a self-discharge test is one that passed a capacity test. As a result, in the embodiment, a battery that is determined defective in a self-discharge test is one in which micro-short-circuiting occurred due to substances that are low in electron conductivity and electrons and lithium ions are desorbed gradually in a long time after charging. Examples of substances that are low in electron conductivity and can be mixed into a battery are substances that come off the positive electrode.

In the embodiment of FIGS. 1 and 2, a cause of a defective secondary battery is determined based on the above understandings. The embodiment provides a secondary battery tester and a secondary battery testing method which can produce test results that are small in variation and high in reproducibility.

Figure 3:
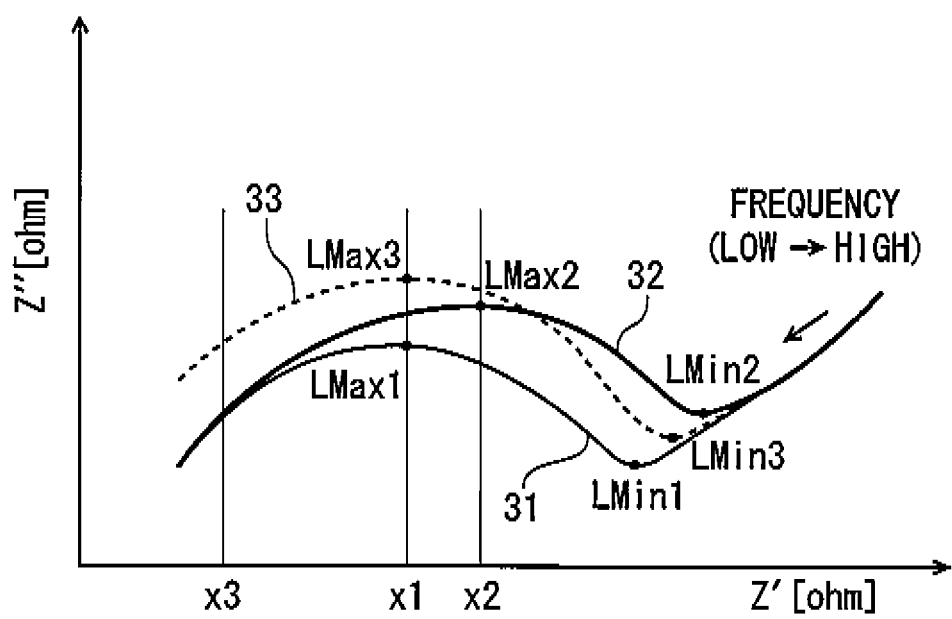
FIG. 3 is a graph showing example impedance Nyquist plots of test subject batteries.

FIG. 3 is a graph showing example impedance Nyquist plots (impedance characteristics, also called Cole-Cole plots) of test subject batteries 2 which are measurement results of the impedance measuring section 12.

In the graph of FIG. 3, the vertical axis and the horizontal axis represent the imaginary part $Z''$ and the real part $Z'$, respectively, of the complex impedance of a test subject battery 2.

In FIG. 3, a curve 31 is of a normal test subject battery 2 and hence is, for example, the above-mentioned representative characteristic. The impedance varies in the direction indicated by the arrow as the frequency varies from a low frequency to a high frequency.

The values of the curve 31 shown in FIG. 3 are stored in the storage section 31 of the tester 1 shown in FIG. 1.

As the frequency of an impedance measurement increases, the imaginary part $Z''$ of the impedance of the curve 31 decreases monotonously until reaching a local minimum value LMin1. Then, the impedance follows an arc and its imaginary part $Z'$ reaches a local maximum value LMax1 (peak of an arc). The real part $Z'$ corresponding to the local maximum value LMax1 (imaginary part $Z''$) has a value x1.

In general, an impedance measurement of a lithium ion secondary battery produces a Nyquist plot having a distorted arc. This is because arcs that correspond to reactions occurring at various portions such as the SEI surface and the separator are superimposed on arcs that correspond to reactions occurring at the positive electrode surface and the negative electrode surface. Among the arcs that correspond to reactions occurring at the various portions, the arc that corresponds to the reaction occurring at the SEI surface appears on the high-frequency side and the arcs that correspond to the reactions occurring at the other portions appear on the low-frequency side.

Since the self-discharge of lithium ion secondary batteries is caused by characteristics of the negative electrode, it is necessary to extract information of an arc corresponding to the negative electrode surface. In the charged state attained by step S1, an arc corresponding to the negative electrode surface appears dominantly. Therefore, the low-frequency-side arc can generally be regarded as corresponding to the reaction occurring at the negative electrode.

In FIG. 3, a curve 32 represents an impedance characteristic of a case that the SEI layer is being destroyed by hydrofluoric acid. The impedance arc is distorted; more specifically, the imaginary part of the impedance of a low-frequency portion of the arc is larger than in the curve 31 of a good battery and the low-frequency portion of the arc is distorted more than in the curve 31. For example, this distortion can be detected as a shift of the arc peak in the positive direction on the real axis (rightward in FIG. 3). In FIG. 3, the peak position of the arc of the case of a good battery (curve 31) is denoted by symbol "x1" and the peak position of the arc of a case that the SEI layer is being destroyed by hydrofluoric acid (curve 32) is represented by symbol "x2."

As the frequency of the impedance measurement increases, the imaginary part Z" of the impedance of the curve 32 decreases monotonously until reaching a local minimum value LMin2. Then, the impedance follows an arc and its imaginary part Z" reaches a local maximum value LMax2 (peak of an arc). The real part Z' corresponding to the local maximum value LMax2 (imaginary part Z") has a value x2.

The value x2 is larger than the value x1. The real part Z' corresponding to the local minimum value LMin2 is larger than that corresponding to the local minimum value LMin1, and the local minimum value LMin2 (imaginary part Z") is larger than the local minimum value LMin1 (imaginary part Z"). The real part Z' corresponding to the local maximum value LMax2 is larger than that corresponding to the local maximum value LMax1, and the local maximum value LMax2 (imaginary part Z") is larger than the local maximum value LMax1 (imaginary part Z").

In FIG. 3, a curve 33 represents an impedance characteristic of a case that micro-short-circuiting due to substances that are low in electron conductivity is occurring. Whereas the imaginary part values of the arc are larger than in the curve 31 of a good battery, the arc is not distorted and its peak has almost no shift in the positive direction on the real axis (rightward in FIG. 3).

As the frequency of the impedance measurement increases, the imaginary part Z" of the impedance of the curve 33 decreases monotonously until reaching a local minimum value LMin3. Then, the impedance follows an arc and its imaginary part Z" reaches a local maximum value LMax3 (peak of an arc). The real part Z' corresponding to the local maximum value LMax3 (imaginary part Z") has a value that is approximately equal to the value x1.

The real part Z' corresponding to the local minimum value LMin3 is larger than that corresponding to the local minimum value LMin1, and the local minimum value LMin3 (imaginary part Z") is larger than the local minimum value LMin1 (imaginary part Z"). The real part Z' corresponding to the local maximum value LMax3 is larger than that corresponding to the local maximum value LMax1, and the local maximum value LMax3 (imaginary part Z") is larger than the local maximum value LMax1 (imaginary part Z").

Since the shape of the arc varies depending on the presence/absence of a self-discharge failure and its cause, presence/absence of a self-discharge failure and its cause can be determined at step S3-S7. More specifically, at step S3, presence/absence of a self-discharge failure can be detected on the basis of whether or not measured impedance values are different from the impedance values of a good battery. At step S5-S7, the case that the SEI layer is being destroyed by hydrofluoric acid and the case that micro-short-circuiting due to substances that are low in electron conductivity is occurring can be discriminated from each other on the basis of whether or not a peak position, on the real axis, of an arc of measured impedance values are deviated from the peak position of the arc of the impedance values of a good battery.

As described above, according to the embodiment, presence/absence of an abnormality in the SEI layer and its cause can be determined using impedance values. Furthermore, an abnormality such as a self-discharge failure can be detected simply in a short time.

In the embodiment, a peak of an arc is detected. It is possible to conduct a test in a shorter time by simplifying the impedance measuring method. Presence/absence of an abnormality in the SEI layer and its cause may be determined by measuring impedance values at two or three or a little more particular frequencies. For example, a frequency corresponding to the position x1 of the arc peak of the curve 31 of a good battery (see FIG. 3), a frequency corresponding to the position x2 of the curve 32 of the case in which the SEI layer is being destroyed by hydrofluoric acid, and a high frequency corresponding to a position x3 shown in FIG. 3 (and other frequencies) may be selected as measurement frequencies.

A pass/rejection determination can be made by measuring the imaginary part of an impedance value at a frequency corresponding to the position (real part) x2. More specifically, a determination "pass" is made if an imaginary part measured at the frequency corresponding to the position (real part) x2 is small, and a determination "rejection" is made if an imaginary part measured at the frequency corresponding to the position (real part) x2 is large (see the curves 32 and 33 shown in FIG. 3).

A cause (micro-short-circuiting or hydrofluoric acid) of an abnormality can be determined measuring the imaginary part of an impedance value at a frequency corresponding to the position (real part) x3. More specifically, the cause is determined to be micro-short-circuiting if an imaginary part measured at the frequency corresponding to the position (real part) x3 is large (see the curve 33), and the cause is determined to be hydrofluoric acid if an imaginary part measured at the frequency corresponding to the position (real part) x3 is small (see the curve 32).

As described above, the secondary battery tester etc. according to the invention makes it possible to recognize the state of the SEI layer of a secondary battery correctly because it is determined on the basis of impedance values.

The application range of the invention is not limited to the above embodiment, and the invention can broadly be applied to secondary battery testers etc. which examine the state of a secondary battery on the basis of an impedance characteristic.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A secondary battery tester for testing a state of a secondary battery based on an impedance characteristic of the secondary battery, the tester comprising:
    an impedance acquiring section configured to acquire an impedance value of the secondary battery; and
    a determining section configured to determine a state of a solid electrolyte interface (SEI) layer of the secondary battery based on the impedance value acquired by the impedance acquiring section,
    wherein the second battery is a lithium ion secondary battery, and
    wherein the impedance acquiring section is configured to acquire the impedance value of the secondary battery when a voltage of the secondary battery is close to a lower limit of a use voltage range of the secondary battery.

2. The tester according to claim 1, wherein
    the determining section is configured to determine the state of the SEI layer based on a shape of an arc of a Nyquist plot of the impedance value.

3. The tester according to claim 1, wherein the determining section is configured to detect that the SEI layer is abnormal due to hydrofluoric acid, based on the impedance value.

4. The tester according to claim 1, wherein the determining section is configured to detect that the SEI layer is abnormal due to micro-short-circuiting, based on the impedance value.

5. The tester according to claim 1, wherein the impedance acquiring section is configured to acquire an impedance value of the secondary battery for each of a plurality of frequencies.

6. A secondary battery tester for testing a state of a secondary battery based on an impedance characteristic of the secondary battery, the tester comprising:
    a voltage setting section that sets a voltage of the secondary battery to a voltage that is close to a lower limit of a use voltage range of the secondary battery;
    an impedance acquiring section configured to acquire an impedance value of the secondary battery; and
    a determining section configured to determine a state of the secondary battery based on the impedance value acquired by the impedance acquiring section.

7. The tester according to claim 6, wherein the determining section is configured to determine whether self-discharge of the secondary battery is defective or not, based on impedance value.

8. A method of testing a secondary battery, comprising: testing a state of the secondary battery based on an impedance characteristic of the secondary battery, the testing step comprising:
    (a) setting a voltage of the secondary battery to a voltage that is close to a lower limit of a use voltage range of the secondary battery;
    (b) acquiring an impedance value of the secondary battery; and
    (c) determining a state of the secondary battery based on the impedance value.

9. The tester according to claim 1, further comprising:
    a storage section for storing prescribed impedance values.

10. The tester according to claim 9, wherein,
    the storage section stores a peak position of an arc in an impedance Nyquist plot.

11. The tester according to claim 10, wherein,
    the storage section stores a threshold value for pass or rejection of a secondary battery.

12. The tester according to claim 1, wherein a determined state of the solid electrolyte interface (SEI) layer of the secondary battery based on the impedance value is used to indicate whether or not the secondary battery is defective.

13. The tester according to claim 1, wherein a determined state of the solid electrolyte interface (SEI) layer of the secondary battery based on the impedance value is used to indicate acceptance or rejection of the secondary battery during a manufacturing process.

14. The method according to claim 8, wherein a determined state of the solid electrolyte interface (SEI) layer of the secondary battery based on the impedance value is used to indicate whether or not the secondary battery is defective.

15. The method according to claim 8, wherein a determined state of the solid electrolyte interface (SEI) layer of the secondary battery based on the impedance value is used to indicate acceptance or rejection of the secondary battery during a manufacturing process.

* * * * *